(12) United States Patent
Suzuki

(10) Patent No.: US 10,304,787 B2
(45) Date of Patent: May 28, 2019

(54) SEMICONDUCTOR DEVICE, DISPLAY PANEL, DISPLAY DEVICE, AND ELECTRONIC DEVICE

(71) Applicant: SONY CORPORATION, Tokyo (JP)

(72) Inventor: Jun Suzuki, Kanagawa (JP)

(73) Assignee: SONY SEMICONDUCTOR SOLUTIONS CORPORATION, Kanagawa (JP)

( * ) Notice: Subject to any disclaimer, the term of this patent is extended or adjusted under 35 U.S.C. 154(b) by 0 days.

(21) Appl. No.: 15/127,055

(22) PCT Filed: Feb. 10, 2015

(86) PCT No.: PCT/JP2015/053649
§ 371 (c)(1),
(2) Date: Sep. 19, 2016

(87) PCT Pub. No.: WO2015/146328
PCT Pub. Date: Oct. 1, 2015

(65) Prior Publication Data
US 2017/0117262 A1    Apr. 27, 2017

(30) Foreign Application Priority Data
Mar. 26, 2014 (JP) .................. 2014-062887

(51) Int. Cl.
*H01L 23/58* (2006.01)
*H01L 23/498* (2006.01)
(Continued)

(52) U.S. Cl.
CPC .......... *H01L 23/58* (2013.01); *G09G 3/2003* (2013.01); *H01L 21/4846* (2013.01);
(Continued)

(58) Field of Classification Search
CPC ..... H01L 23/145; H01L 23/48; H01L 23/488; H01L 23/498; H01L 23/49805; H01L 23/49811; H01L 23/49816; H01L 23/49838; H01L 23/5386; H01L 23/58
See application file for complete search history.

(56) References Cited

U.S. PATENT DOCUMENTS 4,859,808 A * 8/1989 Jeter ................. H01L 23/49572
174/261
5,024,372 A * 6/1991 Altman ................... H01L 24/11
228/180.22

(Continued)

FOREIGN PATENT DOCUMENTS

JP        05-109819 A    4/1993
JP       2002-198384 A   7/2002
(Continued)

*Primary Examiner* — Eduardo A Rodela
(74) *Attorney, Agent, or Firm* — Chip Law Group

(57) ABSTRACT

Void formation in a semiconductor device is to be prevented. The semiconductor device includes a semiconductor element, signal lines, and a protective layer. In the semiconductor device, the semiconductor element is mounted on a substrate. The signal lines in the semiconductor device are connected to the semiconductor element on the substrate. Further, the protective layer in the semiconductor device is provided in an inter-line region interposed between both edges of two adjacent signal lines among the signal lines on the substrate.

13 Claims, 14 Drawing Sheets

(51) Int. Cl.
   *H01L 23/538*   (2006.01)
   *H01L 23/488*   (2006.01)
   *H01L 25/16*    (2006.01)
   *H01L 25/075*   (2006.01)
   *H01L 23/00*    (2006.01)
   *G09G 3/20*     (2006.01)
   *H01L 21/48*    (2006.01)
   *H01L 25/18*    (2006.01)

(52) U.S. Cl.
   CPC ...... *H01L 23/488* (2013.01); *H01L 23/49811* (2013.01); *H01L 23/49816* (2013.01); *H01L 23/49838* (2013.01); *H01L 23/5386* (2013.01); *H01L 24/29* (2013.01); *H01L 24/32* (2013.01); *H01L 24/83* (2013.01); *H01L 24/95* (2013.01); *H01L 25/0753* (2013.01); *H01L 25/167* (2013.01); *H01L 25/18* (2013.01); *G09G 2320/064* (2013.01); *G09G 2320/0666* (2013.01); *H01L 2224/2919* (2013.01); *H01L 2224/29078* (2013.01); *H01L 2224/32059* (2013.01); *H01L 2224/8322* (2013.01); *H01L 2224/83951* (2013.01)

(56) References Cited

U.S. PATENT DOCUMENTS

| | | | | |
|---|---|---|---|---|
| 5,386,087 A * | 1/1995 | Lee | ........................ | H01R 12/57 174/250 |
| 6,316,736 B1 * | 11/2001 | Jairazbhoy | ............. | H05K 1/111 174/250 |
| 6,461,953 B1 * | 10/2002 | Sakuyama | .......... | H01L 21/4853 438/106 |
| 7,005,585 B2 * | 2/2006 | Ishizaki | ................ | H01L 21/563 174/260 |
| 8,330,277 B2 * | 12/2012 | Machida | ............ | H01L 21/4846 257/773 |
| 9,433,092 B2 * | 8/2016 | Feng | ....................... | H05K 1/111 |
| 2003/0184986 A1 * | 10/2003 | Soga | .................... | H05K 3/3442 361/767 |
| 2008/0135279 A1 * | 6/2008 | Ishido | ............... | H01L 23/49816 174/255 |
| 2010/0182225 A1 * | 7/2010 | Huang | ..................... | G09G 3/32 345/83 |
| 2011/0266039 A1 * | 11/2011 | Tomoda | ................. | H05K 3/305 174/260 |
| 2013/0175943 A1 * | 7/2013 | Tackett | .................. | H05B 37/02 315/250 |

FOREIGN PATENT DOCUMENTS

| | | |
|---|---|---|
| JP | 2005-311109 A | 11/2005 |
| JP | 2007-157800 A | 6/2007 |
| JP | 2009-188275 A | 8/2009 |
| JP | 2009-200270 A | 9/2009 |
| JP | 2011-233733 A | 11/2011 |
| JP | 2012-518199 A | 8/2012 |
| JP | 2013-225656 A | 10/2013 |

* cited by examiner (a)

(b)

(a)

(b)

(a)

(b)

(a)

(b)

SEMICONDUCTOR DEVICE, DISPLAY PANEL, DISPLAY DEVICE, AND ELECTRONIC DEVICE

CROSS REFERENCE TO RELATED APPLICATIONS

This application is a U.S. National Phase of International Patent Application No. PCT/JP2015/053649 filed on Feb. 10, 2015, which claims priority benefit of Japanese Patent Application No. JP 2014-062887 filed in the Japan Patent Office on Mar. 26, 2014. Each of the above-referenced applications is hereby incorporated herein by reference in its entirety.

TECHNICAL FIELD

The present technology relates to a semiconductor device, a display panel, a display device, an electronic device, and a method of manufacturing a semiconductor device. More particularly, the present technology relates to a semiconductor device manufactured by photolithography, a display panel, a display device, an electronic device, and a method of manufacturing a semiconductor device.

BACKGROUND ART

In conventional semiconductor device manufacturing processes, photolithography is often used in forming minute patterns using photographic development techniques. In this photolithography, a certain pattern is formed normally by sequentially performing a process to apply photosensitive resin to a substrate, an exposure process to change the solubility of the photosensitive resin through emission of ultraviolet light or the like, and a development process to remove the photosensitive resin with a particular solvent. According to a suggested method, for example, the photosensitive resin is left around a semiconductor element by photolithography, and the semiconductor element is secured with the left photosensitive resin, before signal lines are connected to the semiconductor element (see Patent Document 1, for example).

CITATION LIST

Patent Document

Patent Document 1: Japanese Patent Application Laid-Open No. 2011-233733

SUMMARY OF THE INVENTION

Problems to be Solved by the Invention

By the above conventional technology, however, the edges of the photosensitive resin under the semiconductor element are eroded by the solvent in the development process, and spaces (hereinafter referred to as the "eroded portions") are formed between the signal lines and the photosensitive resin when the signal lines are connected to the semiconductor element. Further, at the time of coating with a coating agent after the connection of the signal lines, the photosensitive resin remaining around the semiconductor element hinders the coating agent from filling the eroded portions. As a result, voids are formed in the eroded portions, and, when the temperature of the semiconductor element becomes higher, the semiconductor element might be damaged due to thermal expansion of the voids. Also, when reflow is performed in a later component mounting process, the moisture in the voids expands, and the semiconductor element might be damaged. Further, as metal ions move via the voids, an ion migration might occur, resulting in an insulation failure between signal lines.

The present technology has been developed in view of those circumstances, and is to prevent formation of voids in a semiconductor device.

Solutions to Problems

The present technology has been developed to solve the above problems, and a first aspect thereof is a semiconductor device that includes: a semiconductor element mounted on a substrate; signal lines connected to the semiconductor element on the substrate; and a protective layer formed in an inter-line region interposed between both edges of two adjacent signal lines among the signal lines on the substrate. In this configuration, the protective layer is provided in inter-line regions.

In addition, in the first aspect, photosensitive resin may be provided in the inter-line regions, except for at least one of the inter-line regions. With this, the photosensitive resin is provided in the inter-line regions, except for at least one of the inter-line regions.

In addition, in the first aspect, the photosensitive resin may be provided preferentially in a region between signal lines with a small potential difference, the region being of the inter-line regions. With this, the photosensitive resin is provided preferentially in a region between signal lines with a small potential difference among the inter-line regions.

In addition, in the first aspect, the photosensitive resin may be provided in a region between signal lines having substantially the same potential, the region being of the inter-line regions. With this, the photosensitive resin is provided in a region between signal lines having substantially the same potential among the inter-line regions.

In addition, in the first aspect, at least one piece of the photosensitive resin may be provided at each side of the semiconductor element. With this, at least one piece of the photosensitive resin is provided at each side of the semiconductor element.

In addition, in the first aspect, the photosensitive resin may not be provided between terminals with a larger potential difference than a predetermined level. With this, the photosensitive resin is not provided between terminals with a larger potential difference than a predetermined level.

In addition, in the first aspect, the signal lines may transmit a gradation signal indicating a gradation of a predetermined color, the gradation signal being to be supplied to a light-emitting element, and the photosensitive resin may be provided in the inter-line region between the signal lines transmitting the gradation signal. With this, the photosensitive resin is provided in the inter-line region between signal lines that transmit a gradation signal.

In addition, in the first aspect, the signal lines may include a signal line that transmits a first gradation signal indicating a gradation of a first color, and a signal line that transmits a second gradation signal indicating a gradation of a second color. With this, the photosensitive resin is provided in the inter-line region between signal lines including a signal line that transmits the first gradation signal, and a signal line that transmits the second gradation signal.

In addition, in the first aspect, the gradation signal may be a pulse signal with a pulse width corresponding to a light emission period of the light-emitting element. With this, the light-emitting element emits light in accordance with a pulse signal having a pulse width corresponding to a light emission period of the light-emitting element.

In addition, in the first aspect, the signal lines may include a non-transmission line that transmits no signals, and a transmission line that transmits a signal, and the photosensitive resin may be provided between the non-transmission line and the transmission line. With this, the photosensitive resin is provided between a non-transmission line and a transmission line.

In addition, in the first aspect, the signal lines may include input lines that transmit input signals to the semiconductor device, and the photosensitive resin may be provided in the inter-line region between the input lines. With this, the photosensitive resin is provided in the inter-line region between the input lines.

In addition, in the first aspect, the signal lines may include output lines that transmit output signals from the semiconductor device, and the photosensitive resin may be provided in the inter-line region between the output lines. With this, the photosensitive resin is provided in the inter-line region between the output lines.

In addition, in the first aspect, the protective layer may be formed with a transparent resin. With this, the protective layer is formed with a transparent resin.

In addition, a second aspect of the present technology is a display panel that includes: a light-emitting element that emits light; a semiconductor element that drives the light-emitting element on a substrate; signal lines connected to the semiconductor element on the substrate; and a protective layer formed in an inter-line region interposed between both edges of two adjacent signal lines among the signal lines on the substrate. In this configuration, the protective layer is provided in inter-line regions.

In addition, a third aspect of the present technology is a display device that includes: a light-emitting element that emits light; a semiconductor element that drives the light-emitting element in accordance with a control signal on a substrate; a control unit that generates the control signal; signal lines connected to the semiconductor element on the substrate; and a protective layer formed in an inter-line region interposed between both edges of two adjacent signal lines among the signal lines on the substrate. In this configuration, the inter-line regions are covered with a protective layer.

In addition, a fourth aspect of the present technology is an electronic device that includes: a semiconductor element that operates in accordance with a control signal on a substrate; a control unit that generates the control signal; signal lines connected to the semiconductor element on the substrate; and a protective layer formed in an inter-line region interposed between both edges of two adjacent signal lines among the signal lines on the substrate. In this configuration, the inter-line regions are covered with a protective layer.

In addition, a fifth aspect of the present technology is a semiconductor device manufacturing method that includes: a removal step of removing photosensitive resin from at least one inter-line region interposed between both edges of two adjacent wiring paths among wiring paths on a substrate to which the photosensitive resin is applied; a wiring step of disposing signal lines in the respective wiring paths, and connecting the signal lines to a semiconductor element; and a coating step of coating the inter-line regions with a protective layer. With this method, the inter-line regions are covered with a protective layer.

In addition, in the fifth aspect, the removal step may include: an exposure step of exposing the photosensitive resin in the inter-line regions, except for at least one of the inter-line regions; and a development step of removing the photosensitive resin with a particular solvent from at least one of the inter-line regions. With this method, the photosensitive resin is exposed in the regions excluding at least one of the inter-line regions, and the photosensitive resin is removed with a particular solvent from at least one of the inter-line regions.

Effects of the Invention

According to the present technology, it is possible to achieve an excellent effect in preventing formation of voids in a semiconductor device. Note that the effects of the present technology are not limited to the effects described herein, and may include any of the effects described in the present disclosure.

MODES FOR CARRYING OUT THE INVENTION

The following is a description of modes for carrying out the present technology (the modes will be hereinafter referred to as embodiments). Explanation will be made in the following order.

1. Embodiment (an example where inter-line regions are covered with a protective layer)
2. Modification (an example where positive photosensitive resin is used, and inter-line regions are covered with a protective layer)

1. Embodiment

[Example Configuration of Display Device]

Figure 1:
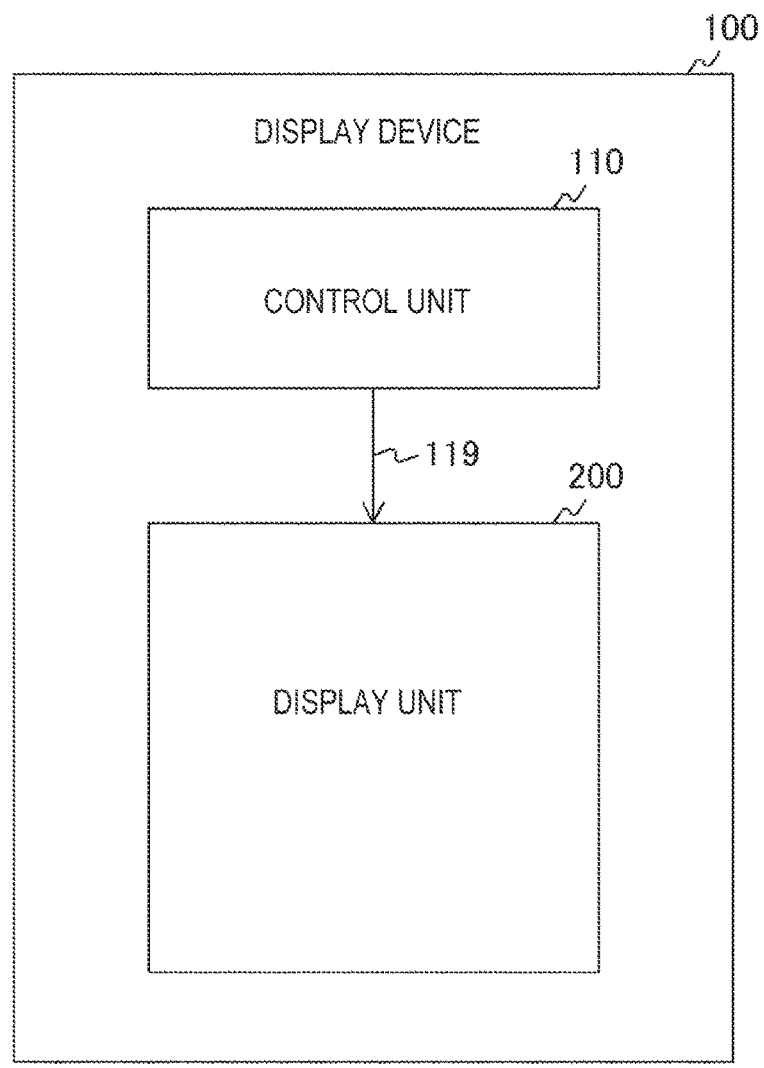
FIG. 1 is a block diagram showing an example configuration of a display device according to an embodiment.

FIG. 1 is a block diagram showing an example configuration of a display device 100 according to an embodiment. This display device 100 is a device that displays a moving image or a still image, and includes a control unit 110 and a display unit 200.

The control unit 110 controls the entire display device 100. This control unit 110 generates control signals such as timing signals and pixel signals, and a power supply signal, an supplies these signals to the display unit 200 via a signal line 119. Here, the timing signals include a horizontal synchronization signal and a vertical synchronization signal. In addition, the pixel signals include signals indicating respective gradations of R (Red), G (Green), and B (Blue), for example. The display unit 200 displays a moving image or the like, under the control of the control unit 110.

(Example Configuration of Display Unit)

Figure 2:
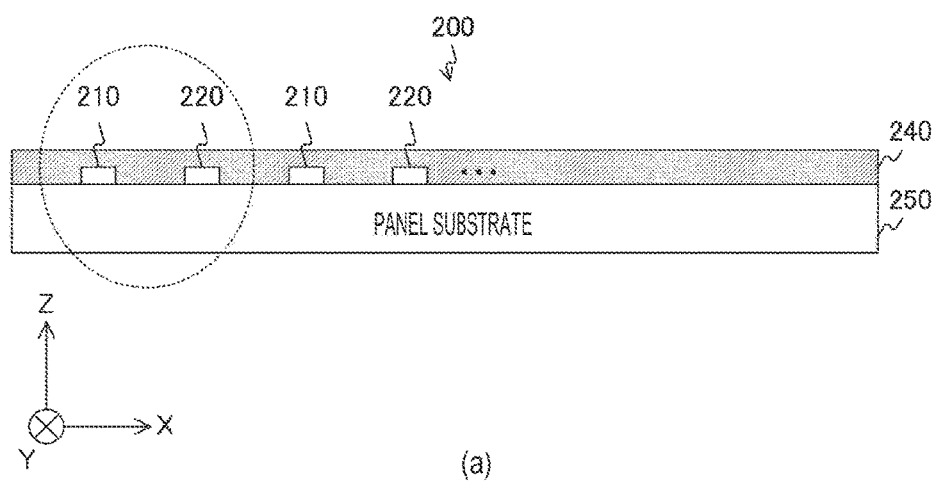
FIG. 2 is an example of a cross-sectional view of a display unit according to the embodiment.
Figure 2:
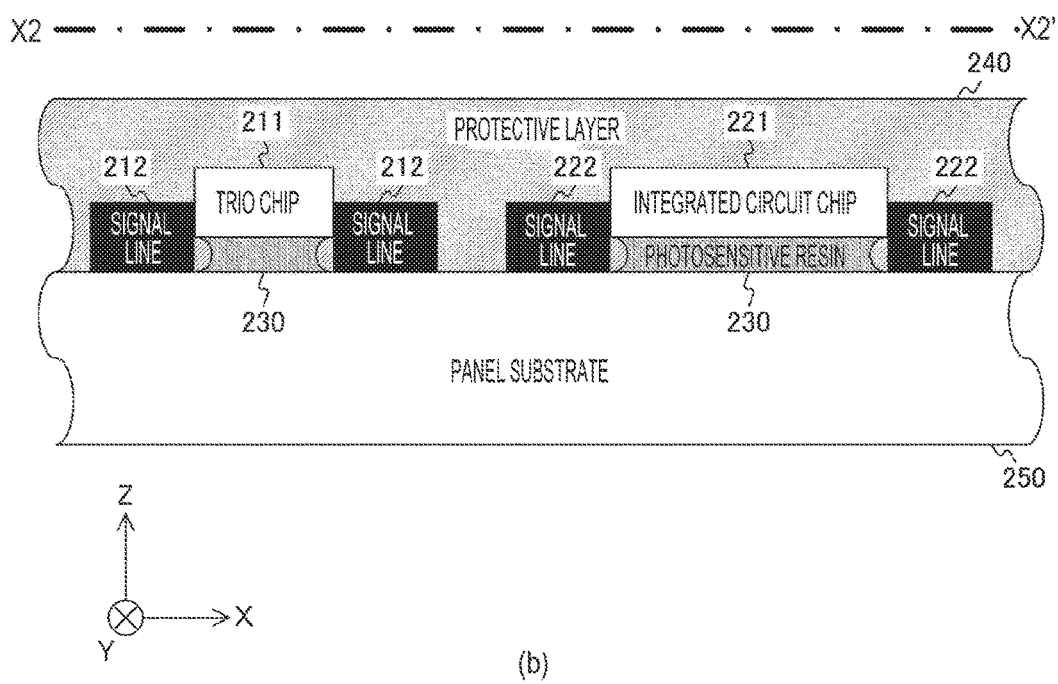

FIG. 2 is an example of a cross-sectional view of the display unit 200 according to the embodiment. In the drawing, a is an example of a cross-sectional view of the entire display unit 200. This display unit 200 includes semiconductor devices 210, semiconductor devices 220, a protective layer 240, and a panel substrate 250.

The panel substrate 250 is a substrate on which the semiconductor devices 210 and 220 are mounted. For example, a glass epoxy board is used as the panel substrate 250. In the description below, a predetermined axis parallel to the plane of the panel substrate is the X-axis, and an axis that is parallel to the plane and perpendicular to the X-axis is the Y-axis. In addition, an axis perpendicular to the X-axis and the Y-axis is the Z-axis.

The semiconductor devices 210 emit light, under the control of the semiconductor devices 220. The semiconductor devices 220 drive the semiconductor devices 210 in accordance with pixel signals and timing signals. In addition, the semiconductor devices 210 are arranged in the form of a two-dimensional lattice, for example, and one semiconductor device 220 is provided for one of the semiconductor devices 210.

The protective layer 240 is a layer that covers the semiconductor devices 210 and 220, and protects them from moisture and dust. For example, the protective layer 240 is a coating formed from a coating agent. A transparent resin, such as a silicone-based material with a high resistance to light, is used as this coating agent. Examples of silicone-based materials include hybrid silicones.

In FIG. 2, b is an enlarged cross-sectional view of the portion surrounded by a dotted line in a in the drawing. As shown in b in the drawing, for example, a semiconductor device 210 includes a trio chip 211, signal lines 212, and photosensitive resin 230.

The trio chip 211 is a semiconductor chip formed with a combination of a light-emitting element that emits light in red, a light-emitting element that emits light in green, and a light-emitting element that emits light in blue.

The signal lines 212 transmit predetermined signals. The signal lines 212 are disposed in wiring paths around the trio chip 211, and connect terminals in the trio chip 211 to terminals in the panel substrate 250.

The photosensitive resin 230 is a resin that varies in solubility in or affinity for a certain solvent, with exposure using light of a certain wavelength (ultraviolet light, for example). For example, a resin that becomes lower in solubility with exposure is used as the photosensitive resin 230. Such a photosensitive resin is called a negative photosensitive resin. On the other hand, a photosensitive resin that becomes higher in solubility with exposure is called a positive photosensitive resin.

In addition, the photosensitive resin 230 preferably has tackiness (or adhesive properties) in the state prior to exposure. Further, the photosensitive resin 230 preferably has light-curing properties, and is hardened by exposure.

The photosensitive resin 230 is disposed between the panel substrate 250 and the trio chip 211/an integrated circuit chip 221. Where the direction toward the panel substrate 250 along the Z-axis is the downward direction, the photosensitive resin 230 is disposed under the trio chip 211 and the integrated circuit chip 221.

The integrated circuit chip 221 is a semiconductor chip that drives the trio chip 211 in accordance with control signals (pixel signals and timing signals). This integrated circuit chip 221 includes a light emission control circuit that causes the trio chip 211 to emit light in the gradation and the color indicated by a pixel signal in synchronization with a timing signal, for example.

The trio chip 211 and the integrated circuit chip 221 are bonded to the panel substrate 250 by virtue of the adhesive power of the photosensitive resin 230.

Note that the trio chip 211 and the integrated circuit chip 221 are examples of the semiconductor element in the claims.

The signal lines 222 transmit predetermined signals. The signal lines 222 are disposed in wiring paths around the integrated circuit chip 221, and connect terminals in the integrated circuit chip 221 to terminals in the panel substrate 250. In addition, the signal lines 212 and 222 are arranged at intervals of 50 micrometers, for example.

Note that the semiconductor devices 210 and 220 are mounted on the display device 100, but may not necessarily be mounted on the display device 100. The semiconductor devices 210 and 220 may be mounted on an electronic device other than a display device. An electronic device other than a display device may be an illuminating device, an image processing device, or the like.

In addition, the trio chip 211 and the integrated circuit chip 221 that performs light emission control are used as the semiconductor chips, but the semiconductor chips may be some other configurations. Other than the above, the semiconductor chips may be chips on which liquid crystal control elements, photoelectric conversion elements, piezoelectric elements, thin-film transistor elements, thin-film diode elements, resistive elements, switching elements, micromagnetic elements, microoptical elements, or the like are mounted.

[Example Configuration of Semiconductor Device]

Figure 3:
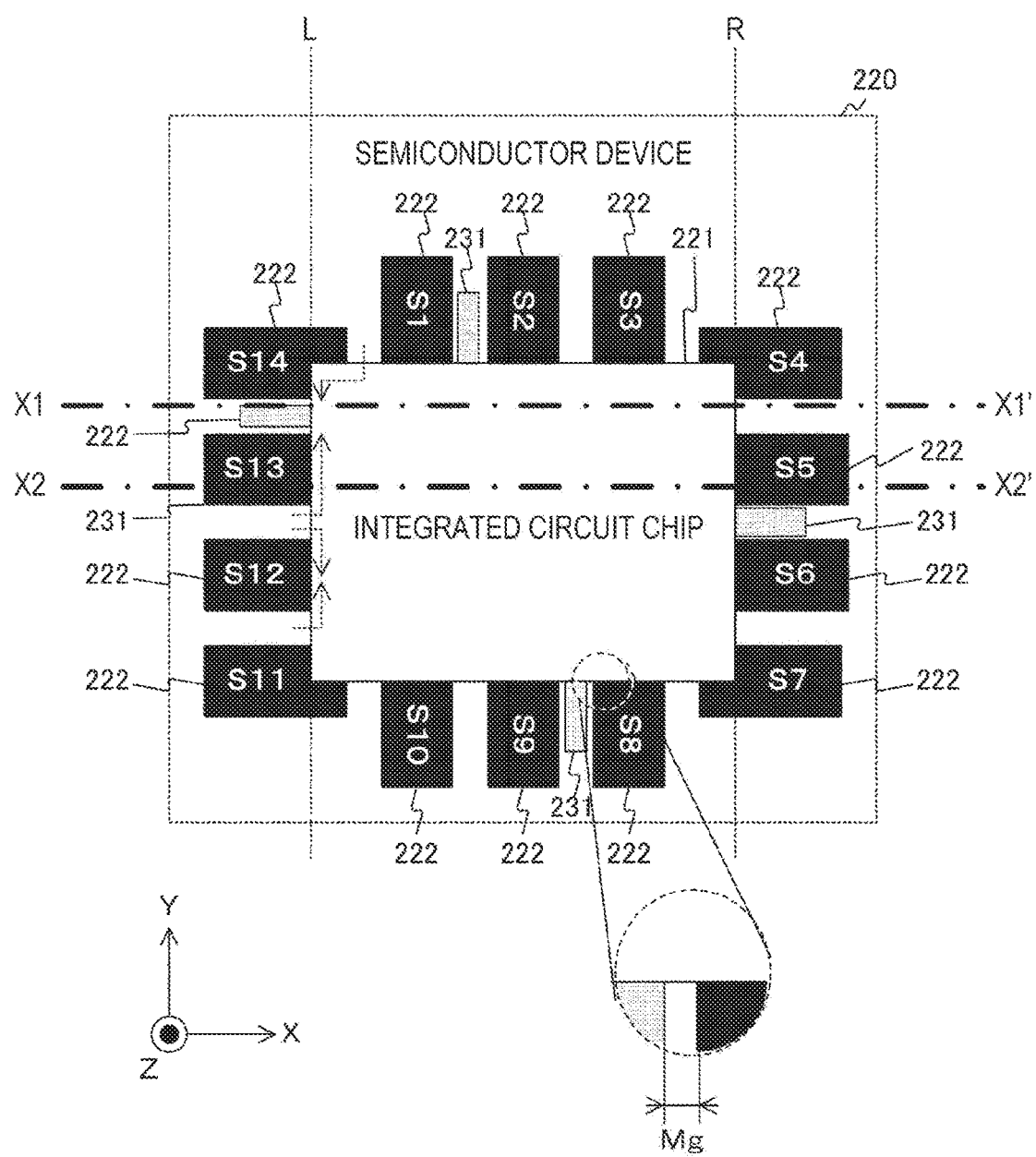
FIG. 3 is an example of a top view of a semiconductor device according to the embodiment.

FIG. 3 is an example of a top view of a semiconductor device 220 according to the embodiment. In this drawing, the protective layer 240 is not shown. In the semiconductor devices 220, a number (14, for example) of signal lines 222 are connected to the integrated circuit chip 221.

These signal lines 222 transmit signals S1 through S14, such as pixel signals and timing signals. In addition, the region interposed between both edges of two adjacent signal lines 222 (this region will be hereinafter referred to as an "inter-line region") is covered with the protective layer 240. Further, photosensitive resin 231 is provided in these inter-line regions, except for at least one of the inter-line regions. The photosensitive resin 231 is hardened portions of the photosensitive resin 230 that is hardened by exposure. The integrated circuit chip 221 is secured by the photosensitive resin 231, and is prevented from shifting in position.

On at least one side of each signal line 222 among all the signal lines 222, the photosensitive resin 231 is not provided, and only the protective layer 240 is preferably formed. In addition, at least one piece of the photosensitive resin 231 is preferably provided at each of the four sides of the integrated circuit chip 221. In addition, a margin Mg is preferably provided between the signal lines 222 and the photosensitive resin 231.

Further, it is preferable to provide the photosensitive resin 231 preferentially between signal lines with small potential differences. In a case where potential differences change over time, the photosensitive resin 231 is provided preferentially between signal lines with small statistic values (such as mean values) of potential differences. There are cases where the numbers of R bits and B bits are smaller than the number of G bits. For example, of 16 bits, five bits each are allocated to R (Red) and B (Blue), and six bits are allocated to G (Green). In this case, the potential difference (or the gradation difference) between R and B is smaller than that between R and G, and that between B and G. In view of this, the photosensitive resin 231 is provided preferentially between a signal line that transmits a gradation signal of R and a signal line that transmits a gradation signal of G. In addition, the photosensitive resin 231 is provided preferentially between a signal line that does not transmit any signal and a signal line that transmits a gradation signal of G. These gradation signals R, G, and B may be pulse signals with the pulse widths corresponding to the light emission periods of the light-emitting elements. The method of controlling light emission periods with pulse widths is called pulse width modulation (PWM) control. In addition, in many cases, input signals are transferred in synchronization with each other, and output signals are transferred in synchronization with each other. The potential difference between input signals and the potential difference between output signals are smaller than the potential difference between an input signal and an output signal. In view of this, the photosensitive resin 231 is provided preferentially between two signal lines that transmit input signals to the semiconductor chip. Alternatively, the photosensitive resin 231 is provided preferentially between two signal lines that transmit output signals from the semiconductor chip. For example, in a case where input signals indicating gradations of R and B, and output signals indicating gradations of R and B are transmitted, the photosensitive resin 231 is provided preferentially between an input signal of R and an input signal of G, or between an output signal of R and an output signal of B. In addition, the potential difference between signal lines that transmit signals of a certain voltage (such as a reference voltage) is relatively small, and therefore, the photosensitive resin 231 is provided preferentially between such signal lines.

Between signal lines with a large potential difference, an ion migration is likely to occur, as metal ions move through an interface between a void and the photosensitive resin 230, an interface between an exposed photosensitive resin portion (230) and an unexposed photosensitive resin portion (231), or a void formed by image development. Due to this ion migration, the contact between the signal lines might become poor. As described above, the photosensitive resin 231 is provided preferentially in regions with small potential differences, so that the above mentioned interfaces are reduced in relative terms in inter-line regions with large potential differences, and the occurrence of ion migrations can be reduced.

In the semiconductor device 210, the photosensitive resin 231 is also provided in some of the inter-line regions, as in the semiconductor device 220. Note that, alternatively, the photosensitive resin 231 may be provided in some of the inter-line regions in one of the semiconductor devices 210 and 220, and the photosensitive resin 231 may be provided in all the inter-line regions in the other one of the semiconductor devices 210 and 220.

[Example Method of Manufacturing Semiconductor Devices]

Figure 4:
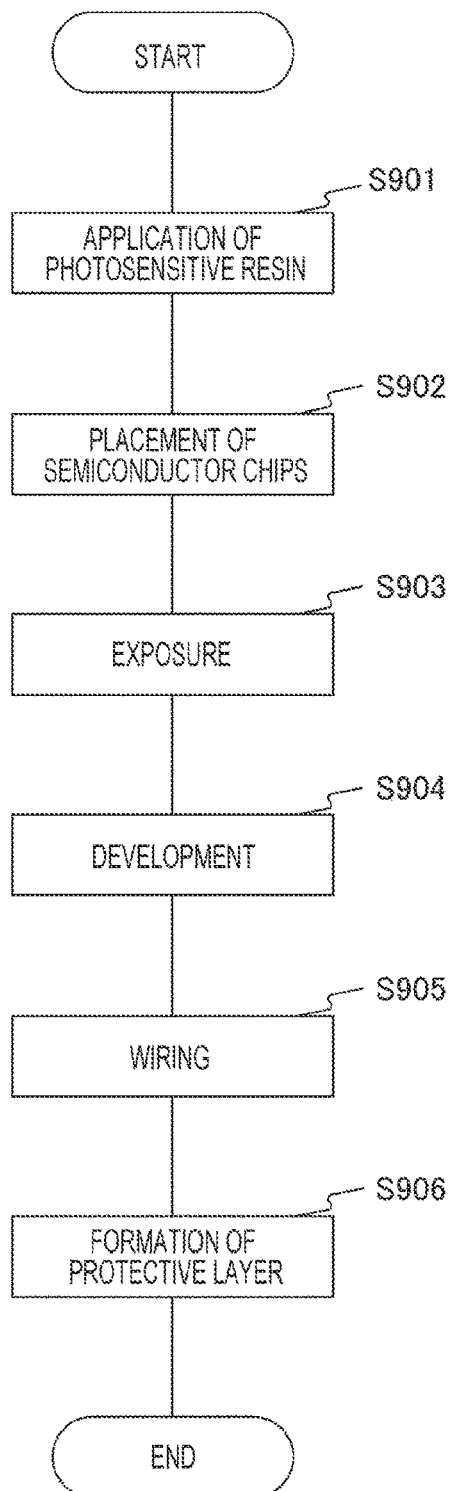
FIG. 4 is an example of a flowchart showing a process of manufacturing the semiconductor devices according to the embodiment.

FIG. 4 is an example of a flowchart showing the process of manufacturing the semiconductor devices 210 and 220 according to the embodiment. The manufacturing process starts when the panel substrate 250 is mounted in a semiconductor device manufacturing apparatus, for example. This manufacturing apparatus includes an applicator, a mounting device, an exposure device, a developing device, a wiring device, and a coating device.

The applicator, such as a spin coater, applies the photosensitive resin 230 uniformly onto the panel substrate 250. In this application process, a spin coat technique is used, to centrifugally apply the photosensitive resin 230 by rotating the panel substrate 250 at a high speed, for example (step S901).

The mounting device, such as a chip mounter, places semiconductor chips (the trio chip 211 and the integrated circuit chip 221) in specific positions on the panel substrate 250 to which the photosensitive resin 230 has been applied (step S902).

The exposure device exposes the inter-line regions, except for at least one of the inter-line regions, around each semiconductor chip mounted on the panel substrate 250 (step S903). Then, the developing device immerses the panel substrate 250 in a specific solvent, to remove the unexposed portions of the photosensitive resin 230. As for the photosensitive resin 230 existing below each semiconductor chip, however, the solvent does not sufficiently infiltrate into the photosensitive resin 230, and therefore, only the edges are removed (step S904).

The wiring device disposes signal lines in the wiring paths, and connects the signal lines to the chips by a plating joining technique or the like (step S905).

The coating device coats the semiconductor chips, signal lines, and the photosensitive resin on the panel substrate 250 with a coating agent such as a transparent resin (step S906). After step S906, the manufacturing apparatus performs various kinds of processing as necessary, and then ends the semiconductor device manufacturing process.

Figure 5:
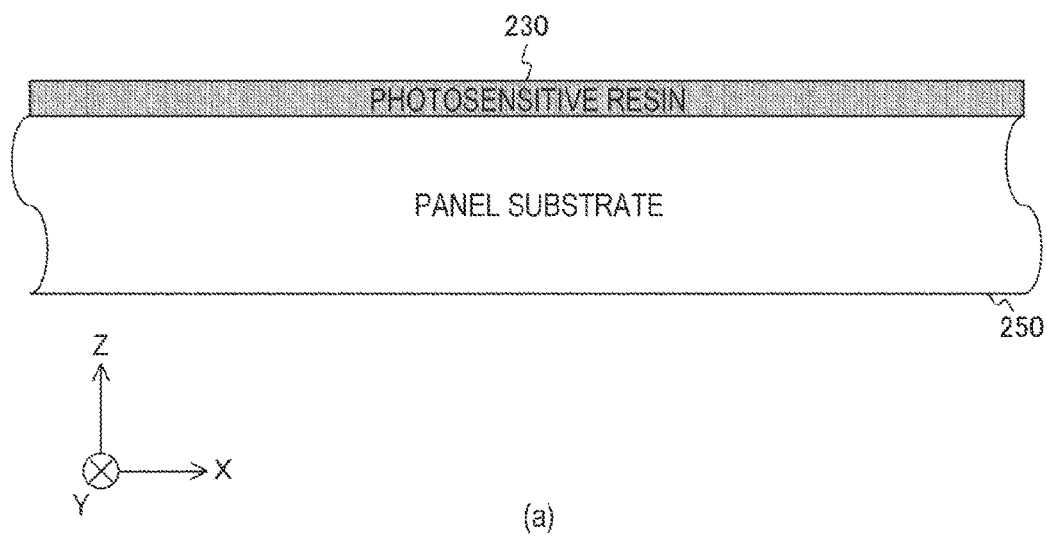
FIG. 5 is a diagram for explaining a photosensitive resin application process and a semiconductor chip mounting process according to the embodiment.
Figure 5:
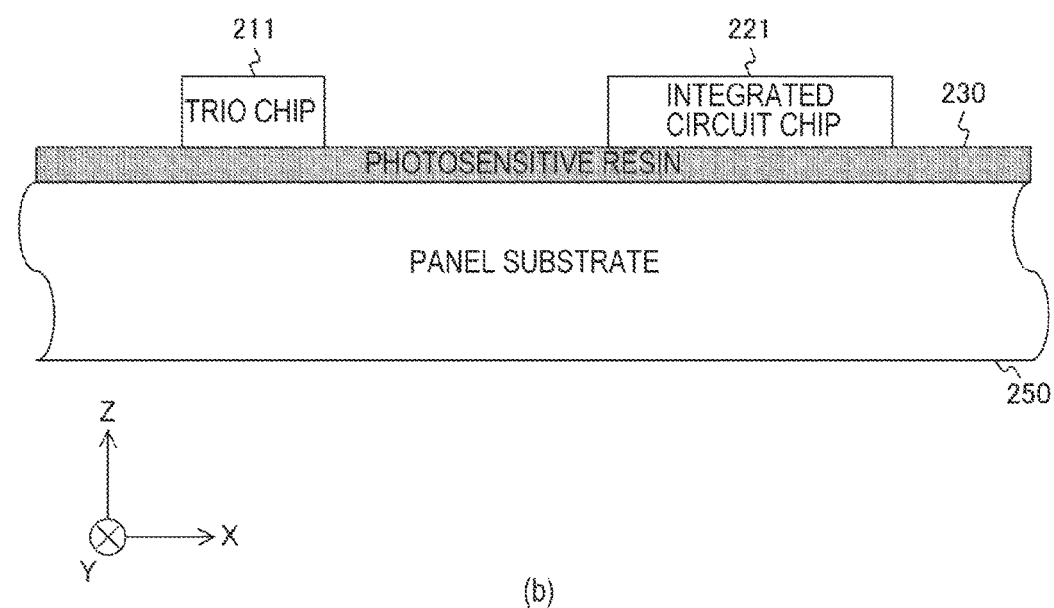

FIG. 5 is a diagram for explaining the process of application of the photosensitive resin 230, and the semiconductor chip mounting process according to the embodiment. In the drawing, a is a diagram for explaining the process of application of the photosensitive resin 230. As shown in a in the drawing, for example, the applicator applies the photosensitive resin 230 uniformly onto the panel substrate 250.

In FIG. 5, b is a diagram for explaining the semiconductor chip mounting process. As shown in b in the drawing, for example, the mounting device places the trio chip 211 and the integrated circuit chip 221 in specific positions on the panel substrate 250 onto which the photosensitive resin 230 has been applied.

Figure 6:
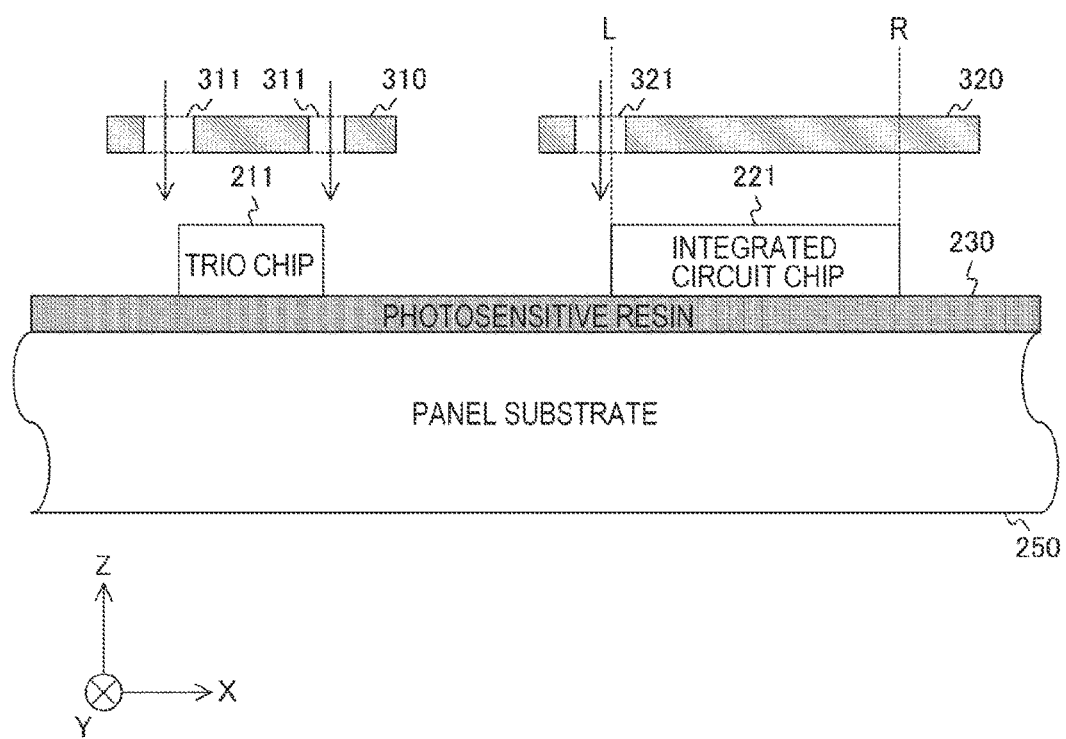
FIG. 6 is a diagram for explaining an exposure process according to the embodiment.

FIG. 6 is a diagram for explaining the exposure process according to the embodiment. As shown in the drawing, for example, the exposure device emits ultraviolet light onto the exposure portions around the trio chip 211 via a photomask 310. In this photomask 310, transparent portions 311 that pass ultraviolet light are formed in the positions corresponding to the exposure portions, and ultraviolet light is emitted through the transparent portions 311. Likewise, ultraviolet light is also emitted onto the exposure portions around the integrated circuit chip 221 via a photomask 320. In this photomask 320, transparent portions 321 are also formed in the positions corresponding to the exposure portions, and ultraviolet light is emitted through the transparent portions 321.

Note that, alternatively, the exposure device may perform exposure, using a photomask formed by integrating the photomasks 310 and 320.

Figure 7:
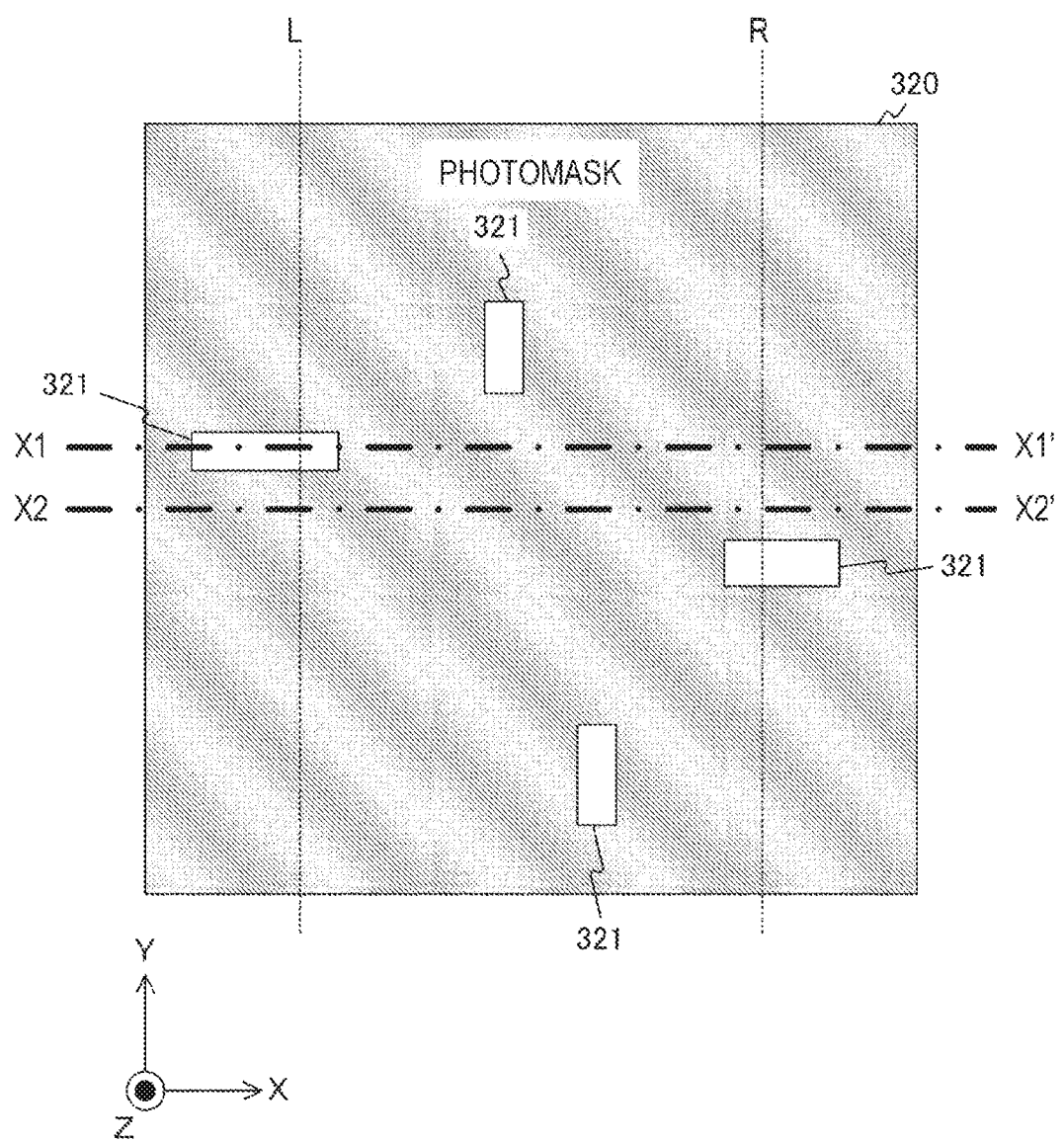
FIG. 7 is an example of a top view of a photomask according to the embodiment.

FIG. 7 is an example of a top view of the photomask 320 according to the embodiment. In this photomask 320, the transparent portions 321 are formed in the positions corresponding to the exposure portions in which the photosensitive resin is to be left. Ultraviolet light is blocked at the shaded portions that exclude the transparent portions 321. Here, the areas of the transparent portions 321 are preferably larger than the areas to be left after the exposure. For example, the transparent portions 321 are so large as to cross the sides of the integrated circuit chip 221.

In the drawing, "L" indicates the position of one of the sides of the integrated circuit chip 221 on the X-axis, and "R" indicates the position of the other one of the sides. The transparent portions 321 formed in positions between signal lines extending in the X-axis direction are so large as to cross the position L or R.

Figure 8:
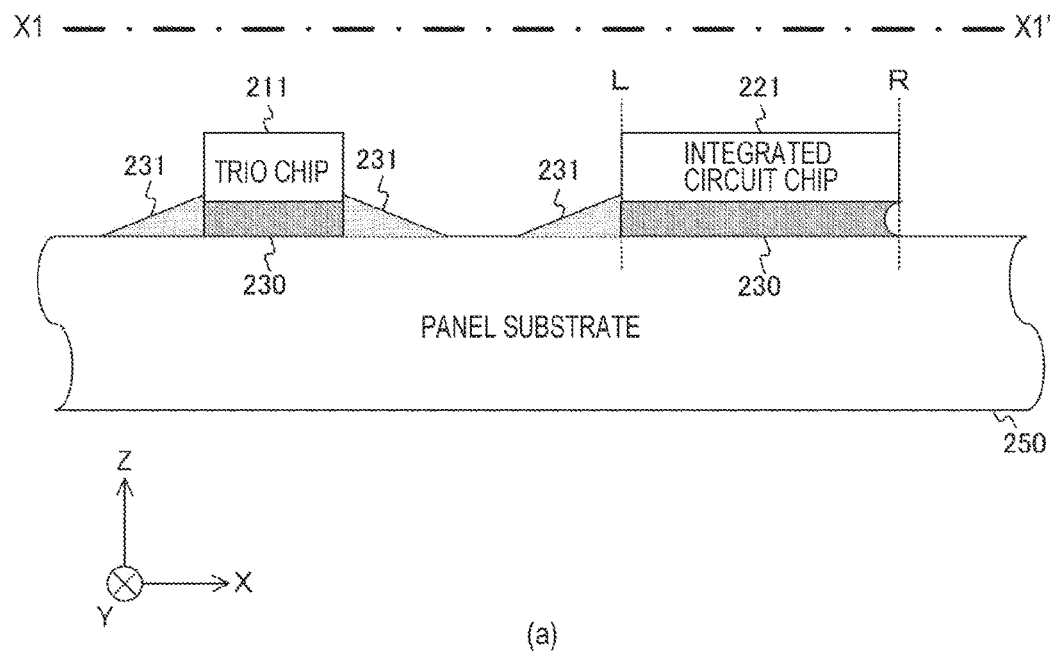
FIG. 8 is a diagram for explaining a development process according to the embodiment.
Figure 8:
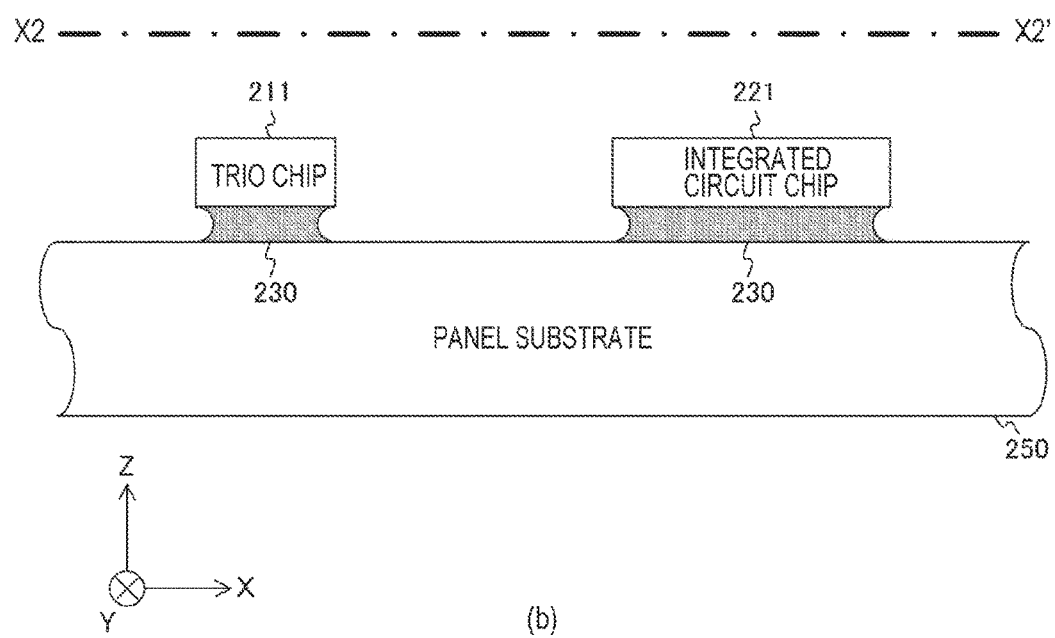

FIG. 8 is a diagram for explaining the development process according to the embodiment. After the exposure process, the developing device immerses the panel substrate 250 in a specific solvent, and the photosensitive resin, except for the exposure portions, is removed. In FIG. 8, a is an example of a cross-sectional view of the display unit 200 after the development, taken along the line X1-X1' defined in FIG. 7. As shown in a in FIG. 8, for example, the exposed photosensitive resin 231 around the semiconductor chips (the trio chip 211 and the integrated circuit chip 221), and the photosensitive resin 230 under the semiconductor chips are left after the development. In addition, an edge of the photosensitive resin 230 is eroded by the solvent.

In FIG. 8, b is an example of a cross-sectional view of the display unit 200 after the development, taken along the line X2-X2' defined in FIG. 7. Since there are no exposure portions in this cross-section, only the photosensitive resin 230 under the semiconductor chips is left after the development. In addition, the edges of the photosensitive resin 230 are eroded by the solvent.

Figure 9:
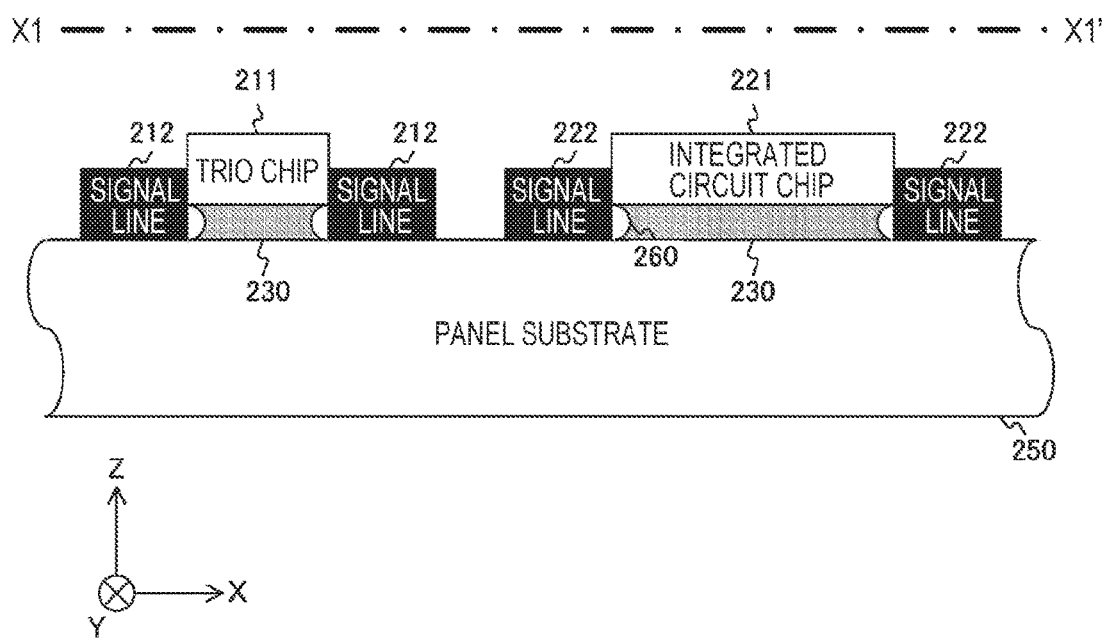
FIG. 9 is a diagram for explaining a wiring process according to the embodiment.

FIG. 9 is a diagram for explaining the wiring process according to the embodiment. As shown in the drawing, for example, the signal lines 212 and 222 are disposed in the wiring paths around the semiconductor chips, and are connected to the semiconductor chips. Since the edges of the photosensitive resin 230 under the semiconductor chips are eroded by the solvent as shown in FIG. 8, spaces (eroded portions 260) are formed between the signal lines and the photosensitive resin 230 under the semiconductor chips.

After the wiring, coating with a transparent resin is performed, and the protective layer 240 is formed. Since the photosensitive resin 231 is not provided in at least one of the inter-line regions around each semiconductor chip as described above, the eroded portions 260 under the semiconductor chips are tightly filled with the transparent resin through those regions not having the photosensitive resin 231 provided therein. Thus, void formation is prevented.

Figure 10:
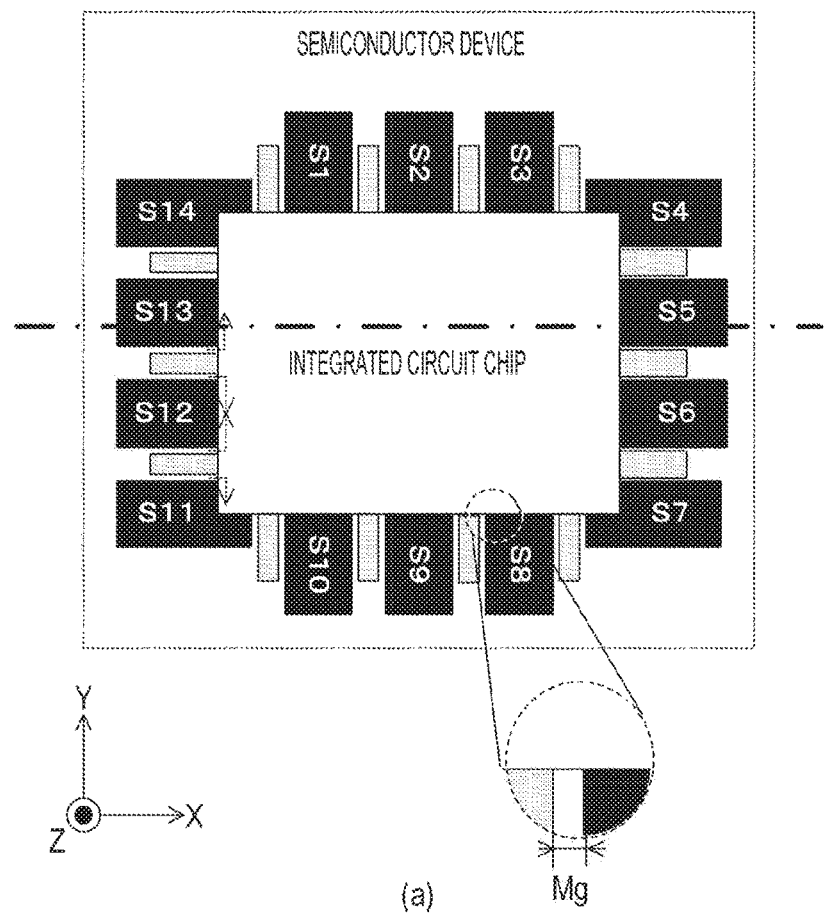
FIG. 10 is an example of a top view and a cross-sectional view of a semiconductor device according to a comparative example.
Figure 10:
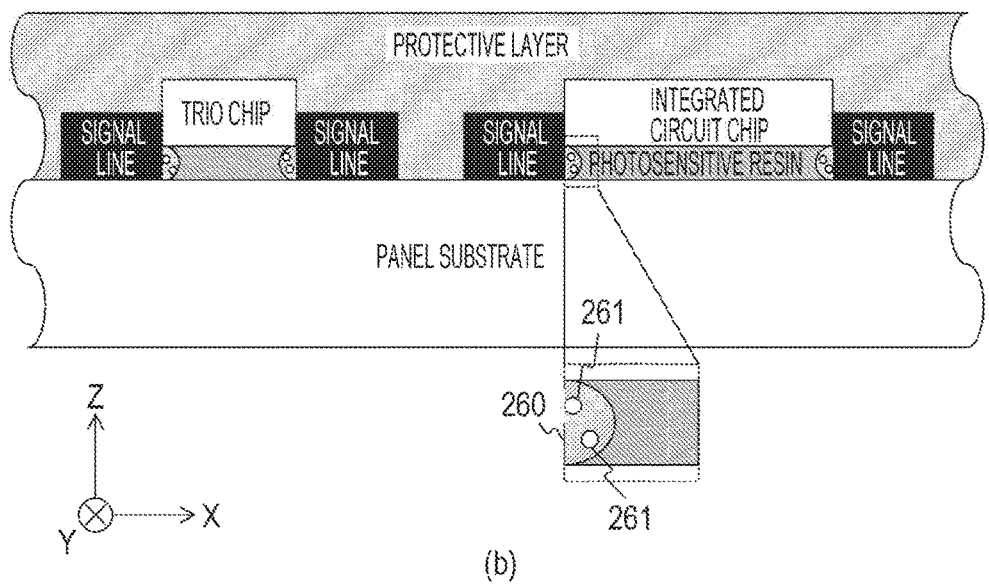

On the other hand, if photosensitive resin is provided in all the inter-line regions, the photosensitive resin hinders the transparent resin from filling the eroded portions 260, as shown in FIG. 10, for example. In the drawing, a is an example of a top view of an integrated circuit chip as a comparative example in which photosensitive resin is provided in all the inter-line regions. In the drawing, b is an example of a cross-sectional view of the comparative example.

As shown in a in FIG. 10, for example, a margin Mg is formed between the photosensitive resin and a signal line, so that the eroded portions 260 are filled with the transparent resin (the protective layer) through the margin Mg. The arrows with dotted lines in a in the drawing indicates the paths through which the transparent resin fills the eroded portions 260. If the margin Mg is narrow, however, the eroded portions are not sufficiently filled with the transparent resin, and voids 261 are formed in the eroded portions 260, as shown in b in the drawing, for example.

Note that, although the semiconductor chips are secured by the negative photosensitive resin 230 that becomes higher in solubility in the solvent with exposure in the above example, the semiconductor chips may be secured by a positive photosensitive resin that becomes lower in solubility with exposure. In such a case, the transparent portions 321 are replaced with light blocking portions that block ultraviolet light in the photomask 323 shown in FIG. 7. In addition, ultraviolet light passes through the photomask 322, except for the light blocking portions.

As described above, according to the embodiment of the present technology, the manufacturing apparatus removes the photosensitive resin from at least one of the inter-line regions, and covers the inter-line regions with the protective layer, so that the spaces between the signal lines and the photosensitive resin can be tightly filled with the protective layer. Thus, void formation can be prevented.

[Modification]

Although exposure and development are performed after the semiconductor chips are placed (mounted) on the substrate in the first embodiment, exposure and development may be performed before the mounting of the semiconductor chips. A semiconductor device according to this modification differs from the first embodiment in that exposure and development are performed before the mounting of the semiconductor chips.

Figure 11:
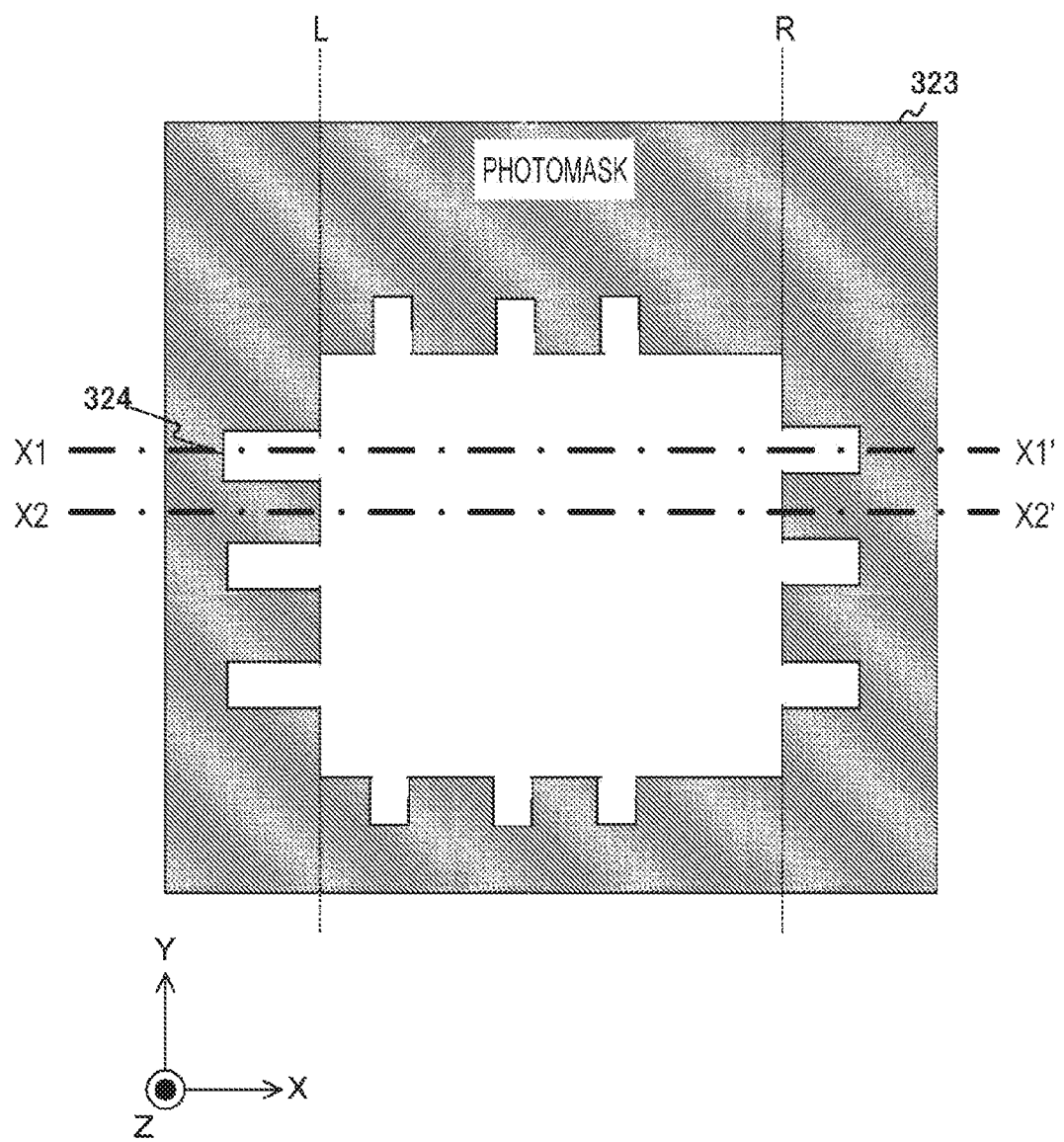
FIG. 11 is an example of a top view of a photomask according to a modification.

FIG. 11 is an example of a top view of a photomask 323 according to the modification. The photomask 323 of the modification differs from the first embodiment in that transparent portions 323 including the portions corresponding to the semiconductor chip as well as the inter-line regions are formed. Note that, in a case where exposure and development are performed before the mounting of the semiconductor chips, transparent portions 323 may be formed at the portions corresponding all the inter-line regions.

Figure 12:
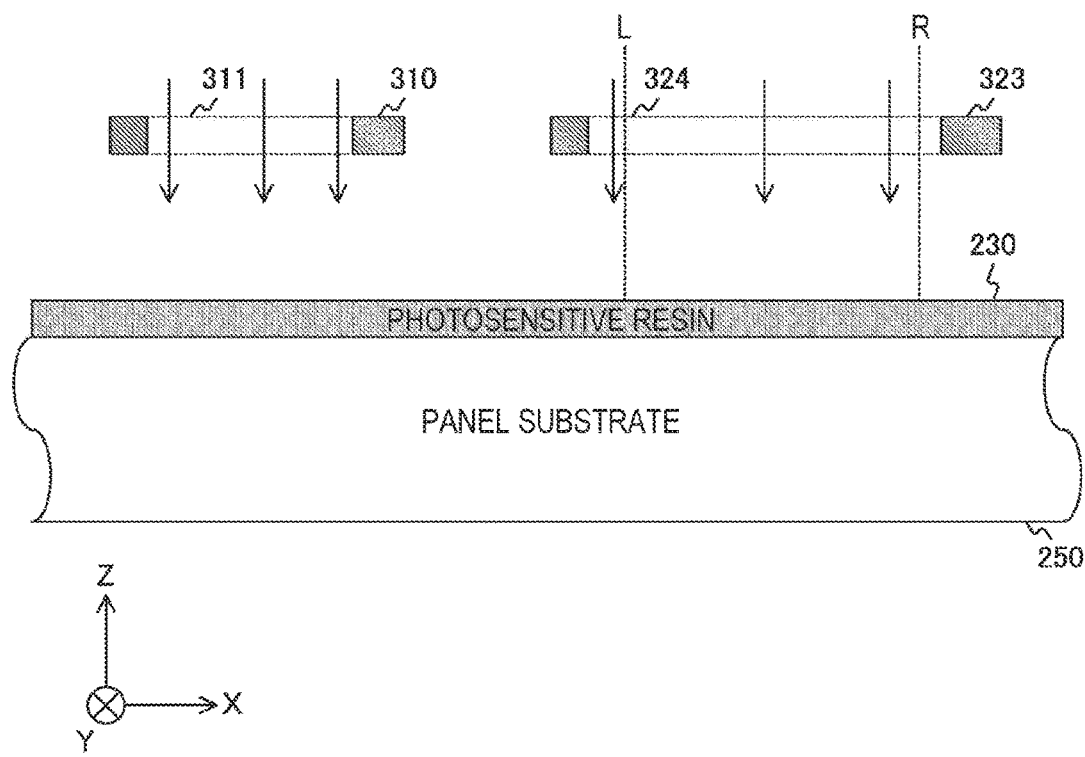
FIG. 12 is a diagram for explaining an exposure process according to the modification.
Figure 13:
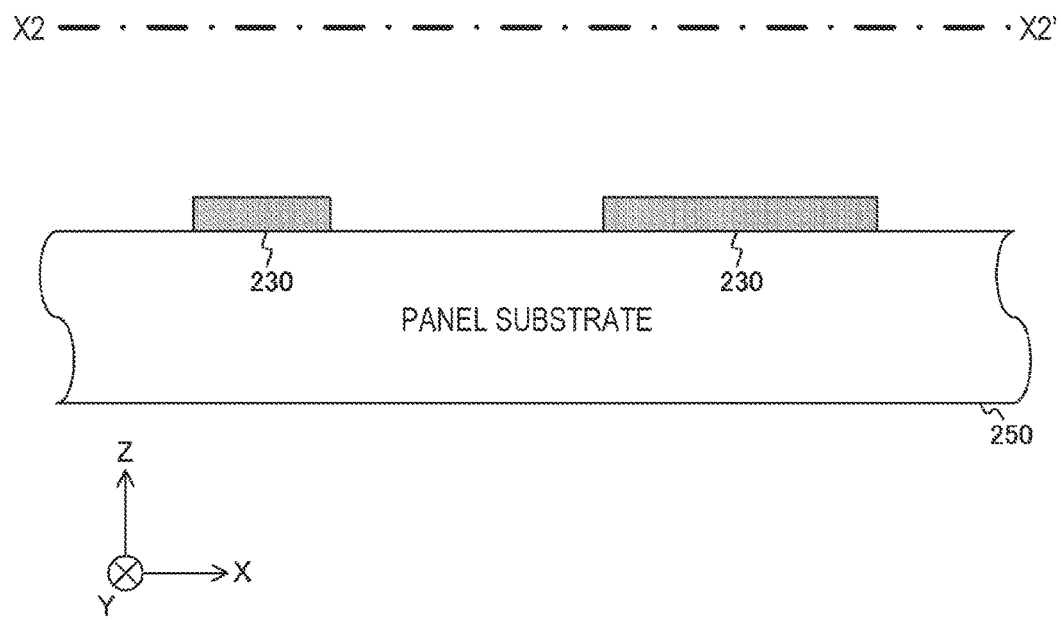
FIG. 13 is a diagram for explaining a development process according to the modification.

FIG. 12 is a diagram for explaining the exposure process according to the modification. In the modification, after the application of the photosensitive resin 230, exposure is performed in a state where any semiconductor chip has not been mounted on the substrate. FIG. 13 is a diagram for explaining the exposure process according to the modification. In the modification, after the exposure, development is performed in a state where any semiconductor chip has not been mounted on the substrate.

Figure 14:
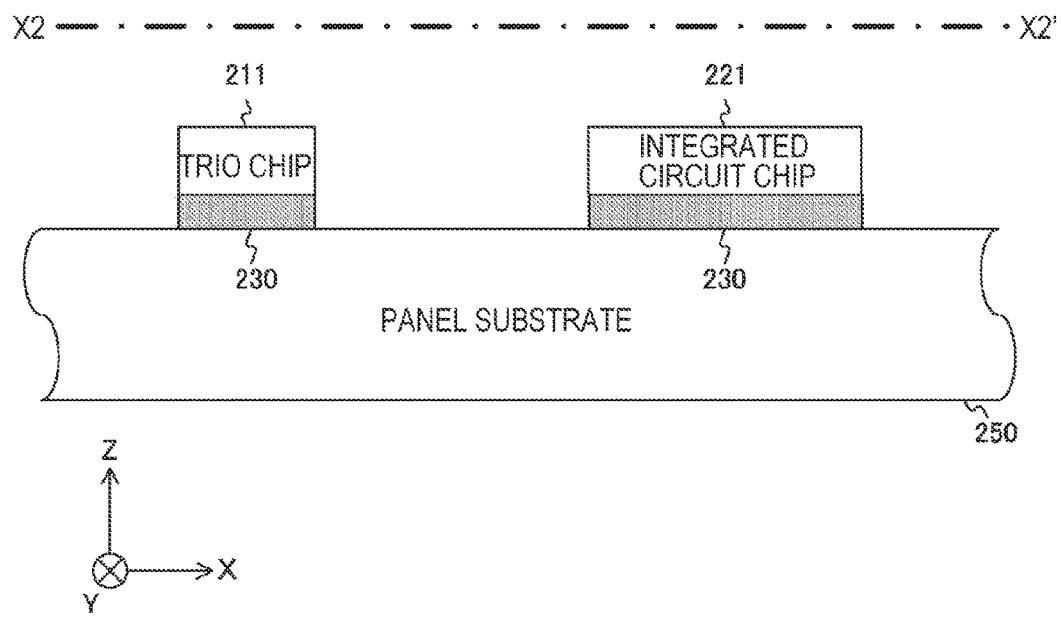
FIG. 14 is a diagram for explaining amounting process according to the modification.
Figure 15:
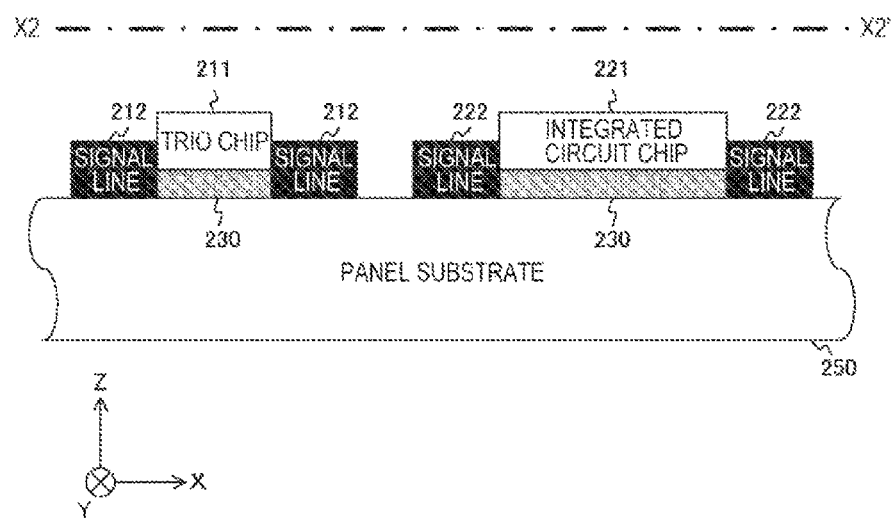
FIG. 15 is a diagram for explaining a wiring process according to the modification.

FIG. 14 is a diagram for explaining the mounting process according to the modification. In the modification, the semiconductor chips are placed (mounted) on the substrate after the exposure and the development. FIG. 15 is a diagram for explaining the wiring process according to the modification. In the modification, wiring is performed after the mounting of the semiconductor chips. As shown in FIGS. 13, 14, and 15, for example, development is performed before the mounting of the semiconductor chips, and thus, the portions under the semiconductor chips are not eroded by the solvent. Note that, in the modification, it is also possible to use a positive photosensitive resin, instead of a negative photosensitive resin.

As described above, according to the modification, exposure and development are performed before the mounting of the semiconductor chips. Thus, void formation can be effectively prevented.

Note that it should be noted that the above described embodiment is an example for embodying the present technology, and the matter of the embodiment corresponds to the subject matter of the claims. Likewise, the subject matter of the claims corresponds to the matter under the same names as the subject matter of the claims in the embodiment of the present technology. However, the present technology is not limited to the embodiment, and various changes can be made to the embodiment without departing from the scope of the technology.

The processing procedures described above in the embodiment may be regarded as a method involving the series of these procedures, or may be regarded as a program for causing a computer to carry out the series of these procedures or a recording medium storing the program. This recording medium may be a Compact Disc (CD), a MiniDisc (MD), a Digital Versatile Disc (DVD), a memory card, or a Blu-ray (a registered trade name) Disc, for example.

Note that the effects of the present technology are not limited to the effects described herein, and may include any of the effects described in the present disclosure.

Note that the present technology may also be embodied in the configurations described below.

(1) A semiconductor device including:
a semiconductor element mounted on a substrate;
a plurality of signal lines connected to the semiconductor element on the substrate; and
a protective layer formed in an inter-line region interposed between both edges of two adjacent signal lines among the signal lines on the substrate.

(2) The semiconductor device of (1), wherein photosensitive resin is provided in the inter-line regions, except for at least one of the inter-line regions.

(3) The semiconductor device of (2), wherein the photosensitive resin is provided preferentially in a region between signal lines with a small potential difference, the region being of the inter-line regions.

(4) The semiconductor device of (2) or (3), wherein the photosensitive resin is provided in a region between signal lines having substantially the same potential, the region being of the inter-line regions.

(5) The semiconductor device of any of (2) through (4), wherein at least one piece of the photosensitive resin is provided at each side of the semiconductor element.

(6) The semiconductor device of any of (2) through (5), wherein the photosensitive resin is not provided between terminals with a larger potential difference than a predetermined level.

(7) The semiconductor device of any of (2) through (6), wherein
the signal lines transmit a gradation signal indicating a gradation of a predetermined color, the gradation signal being to be supplied to a light-emitting element, and
the photosensitive resin is provided in the inter-line region between the signal lines transmitting the gradation signal.

(8) The semiconductor device of (7), wherein the signal lines include a signal line configured to transmit a first gradation signal indicating a gradation of a first color, and a signal line configured to transmit a second gradation signal indicating a gradation of a second color.

(9) The semiconductor device of (7) or (8), wherein the gradation signal is a pulse signal with a pulse width corresponding to a light emission period of the light-emitting element.

(10) The semiconductor device of any of (2) through (9), wherein
the signal lines include a non-transmission line configured to transmit no signals, and a transmission line configured to transmit a signal, and
the photosensitive resin is provided between the non-transmission line and the transmission line.

(11) The semiconductor device of any of (2) through (10), wherein
the signal lines include a plurality of input lines configured to transmit input signals to the semiconductor device, and
the photosensitive resin is provided in the inter-line region between the input lines.

(12) The semiconductor device of any of (2) through (11), wherein
the signal lines include a plurality of output lines configured to transmit output signals from the semiconductor device, and
the photosensitive resin is provided in the inter-line region between the output lines.

(13) The semiconductor device of any of (1) through (12), wherein the protective layer is formed with a transparent resin.

(14) A display panel including:
a light-emitting element configured to emit light;
a semiconductor element configured to drive the light-emitting element on a substrate;
a plurality of signal lines connected to the semiconductor element on the substrate; and
a protective layer formed in an inter-line region interposed between both edges of two adjacent signal lines among the signal lines on the substrate.

(15) A display device including:
a light-emitting element configured to emit light;
a semiconductor element configured to drive the light-emitting element on a substrate in accordance with a control signal;
a control unit configured to generate the control signal;
a plurality of signal lines connected to the semiconductor element on the substrate; and
a protective layer formed in an inter-line region interposed between both edges of two adjacent signal lines among the signal lines on the substrate.

(16) An electronic device including:
a semiconductor element configured to operate in accordance with a control signal on a substrate;
a control unit configured to generate the control signal;
a plurality of signal lines connected to the semiconductor element on the substrate; and
a protective layer formed in an inter-line region interposed between both edges of two adjacent signal lines among the signal lines on the substrate.

(17) A semiconductor device manufacturing method including:
a removal step of removing photosensitive resin from at least one inter-line region interposed between both edges of two adjacent wiring paths among a plurality of wiring paths on a substrate to which the photosensitive resin is applied;
a wiring step of disposing signal lines in the respective wiring paths, and connecting the signal lines to a semiconductor element; and
a coating step of coating the inter-line regions with a protective layer.

(18) The semiconductor device manufacturing method of (17), wherein the removal step includes:
an exposure step of exposing the photosensitive resin in the inter-line regions, except for at least one of the inter-line regions; and
a development step of removing the photosensitive resin with a particular solvent from the at least one of the inter-line regions.

REFERENCE SIGNS LIST

100 Display device
110 Control unit
200 Display unit
210, 220 Semiconductor device
211 Trio chip
212, 222 Signal line
221 Integrated circuit chip
230, 231 Photosensitive resin
240 Protective layer
250 Panel substrate
310, 320, 323 Photomask

The invention claimed is:
1. A semiconductor device, comprising:
a semiconductor element on a substrate;
a plurality of signal lines connected to the semiconductor element on the substrate;
a protective layer in a first inter-line region of a plurality of inter-line regions,
wherein the first inter-line region is between both edges of two adjacent signal lines among the plurality of signal lines on the substrate; and
a photosensitive resin in the plurality of inter-line regions, except for at least one inter-line region of the plurality of the inter-line regions,
wherein the photosensitive resin is in a region between signal lines, of the plurality of signal lines, with a first potential difference,
wherein the first potential difference is less than a first threshold value,
wherein the photosensitive resin is suppressed between terminals with a second potential difference, and
wherein the second potential difference is larger than a second threshold level.

2. The semiconductor device according to claim 1, wherein the region is one of the plurality of inter-line regions.

3. The semiconductor device according to claim 1, wherein at least one piece of the photosensitive resin is at each side of the semiconductor element.

4. The semiconductor device according to claim 1, wherein the plurality of signal lines are configured to:
transmit a gradation signal indicating a gradation of a specific color; and
supply the gradation signal to a light-emitting element, wherein the photosensitive resin is in the first inter-line region, and
wherein the first inter-line region is between the signal lines, of the plurality of signal lines, that transmit the gradation signal.

5. The semiconductor device according to claim 4, wherein the plurality of signal lines include a first signal line and a second signal line,
wherein the first signal line is configured to transmit a first gradation signal that indicates a gradation of a first color, and the second signal line is configured to transmit a second gradation signal that indicates a gradation of a second color.

6. The semiconductor device according to claim 4, wherein the gradation signal is a pulse signal with a pulse width corresponding to a light emission period of the light-emitting element.

7. The semiconductor device according to claim 1, wherein
the plurality of signal lines include a non-transmission signal line configured to transmit no signals, and a transmission line configured to transmit a signal, and
the photosensitive resin is in between the non-transmission signal line and the transmission line.

8. The semiconductor device according to claim 1, wherein
the plurality of signal lines include a plurality of input lines configured to transmit input signals to the semiconductor device, and
the photosensitive resin is in the first inter-line region between the plurality of input lines.

9. The semiconductor device according to claim 1, wherein
the plurality of signal lines include a plurality of output lines configured to transmit output signals from the semiconductor device, and
the photosensitive resin is in the first inter-line region between the plurality of output lines.

10. The semiconductor device according to claim 1, wherein the protective layer comprises a transparent resin.

11. A display panel, comprising:
a light-emitting element configured to emit light;
a semiconductor element configured to drive the light-emitting element on a substrate;
a plurality of signal lines connected to the semiconductor element on the substrate;
a protective layer in a first inter-line region of a plurality of inter-line regions,
wherein the first inter-line region is between both edges of two adjacent signal lines among the plurality of signal lines on the substrate; and
a photosensitive resin in the plurality of inter-line regions, except for at least one inter-line region of the plurality of inter-line regions,
wherein the photosensitive resin is in a region between signal lines, of the plurality of signal lines, with a first potential difference,
wherein the first potential difference is less than a first threshold value,
wherein the photosensitive resin is suppressed between terminals with a second potential difference, and
wherein the second potential difference is larger than a second threshold level.

12. A display device, comprising:
a light-emitting element configured to emit light;
a semiconductor element configured to drive the light-emitting element on a substrate based on a control signal;
a control unit configured to generate the control signal;
a plurality of signal lines connected to the semiconductor element on the substrate;

a protective layer in a first inter-line region of a plurality of inter-line regions, wherein the first inter-line region is between both edges of two adjacent signal lines among the plurality of signal lines on the substrate; and a photosensitive resin in the plurality of inter-line regions, except for at least one inter-line region of the plurality of inter-line regions, wherein the photosensitive resin is in a region between signal lines, of the plurality of signal lines, with a first potential difference, wherein the first potential difference is less than a first threshold value, and wherein the photosensitive resin is suppressed between terminals with a second potential difference, and wherein the second potential difference is larger than a second threshold level.

13. An electronic device, comprising:

a semiconductor element configured to operate based on a control signal on a substrate;

a control unit configured to generate the control signal;

a plurality of signal lines connected to the semiconductor element on the substrate; and a protective layer in a first inter-line region of a plurality of inter-line regions, wherein the first inter-line region is between both edges of two adjacent signal lines among the plurality of signal lines on the substrate; and a photosensitive resin in the plurality of inter-line regions, except for at least one inter-line region of the plurality of inter-line regions, wherein the photosensitive resin is in a region between signal lines, of the plurality of signal lines, with a first potential difference, wherein the first potential difference is less than a first threshold value, and wherein the photosensitive resin is suppressed between terminals with a second potential difference, and wherein the second potential difference is larger than a second threshold level.

\* \* \* \* \*